US010651157B1

(12) United States Patent
Su

(10) Patent No.: US 10,651,157 B1
(45) Date of Patent: May 12, 2020

(54) SEMICONDUCTOR DEVICE AND MANUFACTURING METHOD THEREOF

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/283,081

(22) Filed: Feb. 22, 2019

Related U.S. Application Data

(60) Provisional application No. 62/776,516, filed on Dec. 7, 2018.

(51) Int. Cl.
*H01L 25/065* (2006.01)
*H01L 23/48* (2006.01)
(Continued)

(52) U.S. Cl.
CPC .... *H01L 25/0657* (2013.01); *H01L 21/76852* (2013.01); *H01L 21/76898* (2013.01);
(Continued)

(58) Field of Classification Search
CPC .............. H01L 25/0657; H01L 24/80; H01L 21/76898; H01L 24/08; H01L 25/50;
(Continued)

(56) References Cited

U.S. PATENT DOCUMENTS

2011/0248403 A1* 10/2011 Chandrasekaran ......................... H01L 25/0657
257/770

2012/0292784 A1* 11/2012 Nishio ................ H01L 21/3221
257/774

(Continued)

FOREIGN PATENT DOCUMENTS

| TW | 201308560 A1 | 2/2013 |
|---|---|---|
| TW | 201616626 A | 5/2016 |
| TW | M542244 U | 5/2017 |

OTHER PUBLICATIONS

Office Action dated Nov. 6, 2019 related to Taiwanese Application No. 108110087.

*Primary Examiner* — Fernando L Toledo
*Assistant Examiner* — Adam S Bowen
(74) *Attorney, Agent, or Firm* — Muncy, Geissler, Olds & Lowe, P.C.

(57) ABSTRACT

A semiconductor device includes a first substrate, a through substrate via, a second substrate, and a bonding structure. The first substrate includes a first dielectric material, and the first dielectric material includes a first conductive pad embedded therein. The through substrate via is formed in the first substrate. The second substrate includes a second dielectric material, the second dielectric material includes a second conductive pad embedded therein, the first dielectric material is different from the second dielectric material, the second conductive pad has a first height, the second dielectric material has a second height, and the first height is less than the second height. The bonding structure is formed between the first substrate and the second substrate, wherein the bonding structure includes the first conductive pad bonded to the second conductive pad and the first dielectric material bonded to the second dielectric material.

20 Claims, 6 Drawing Sheets

(51) Int. Cl.
*H01L 21/768* (2006.01)
*H01L 23/00* (2006.01)
*H01L 25/00* (2006.01)

(52) U.S. Cl.
CPC ............ *H01L 23/481* (2013.01); *H01L 24/08* (2013.01); *H01L 24/80* (2013.01); *H01L 25/50* (2013.01); *H01L 2224/08145* (2013.01); *H01L 2224/8012* (2013.01); *H01L 2224/80894* (2013.01); *H01L 2224/80896* (2013.01); *H01L 2225/06524* (2013.01); *H01L 2225/06544* (2013.01); *H01L 2225/06558* (2013.01); *H01L 2225/06589* (2013.01); *H01L 2924/13091* (2013.01); *H01L 2924/351* (2013.01)

(58) Field of Classification Search
CPC ............ H01L 21/76852; H01L 23/481; H01L 2224/8012; H01L 2225/06558; H01L 2225/06524; H01L 2924/13091; H01L 2924/351; H01L 2224/80894; H01L 2225/06544; H01L 2224/80896; H01L 2224/08145; H01L 2225/06589
USPC .......................................................... 257/621
See application file for complete search history.

(56) References Cited

U.S. PATENT DOCUMENTS

| 2013/0169355 | A1* | 7/2013 | Chen ...................... H01L 23/60 324/564 |
| 2013/0252399 | A1* | 9/2013 | Leduc .................... H01L 24/80 438/455 |
| 2013/0270328 | A1* | 10/2013 | Di Cioccio ......... H01L 21/2007 228/176 |
| 2014/0117546 | A1* | 5/2014 | Liu ........................ H01L 24/80 257/751 |
| 2015/0145144 | A1* | 5/2015 | McDonald .......... H01L 25/0657 257/774 |
| 2018/0286846 | A1* | 10/2018 | Lin ....................... H01L 23/481 |

* cited by examiner

SEMICONDUCTOR DEVICE AND MANUFACTURING METHOD THEREOF

PRIORITY CLAIM AND CROSS-REFERENCE

This application claims the priority benefit of U.S. provisional patent application No. 62/776,516, filed on Dec. 7, 2018. The entirety of the above-mentioned patent application is hereby incorporated by reference herein and made a part of this specification.

TECHNICAL FIELD

The present disclosure relates to a semiconductor device and a method for manufacturing the same, and more particularly, to a semiconductor device utilizing different bonding techniques and method for manufacturing the same.

DISCUSSION OF THE BACKGROUND

Semiconductor devices are used in a variety of electronic applications, such as personal computers, cell phones, and other types of electronic equipment. The semiconductor industry continues to improve the integration density of various electronic components (e.g., transistors, diodes, resistors, capacitors, etc.) by continual reduction in minimum feature size, which allow more components to be integrated into a given area. These smaller electronic components also require smaller packages that, in some applications, utilize less area than required by packages under previous technologies.

Three dimensional integrated circuits (3DICs) are a recent development in semiconductor packaging, in which multiple semiconductor dies are stacked upon one another, such as package-on-package (PoP) and system-in-package (SiP) packaging techniques. Some 3DICs are prepared by placing dies over dies on a semiconductor wafer. Such 3DICs provide improved integration density and other advantages, such as faster speeds and greater bandwidth, because of the decreased length of interconnects between the stacked dies. However, there are many challenges related to 3DICs.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device, including a first substrate, a through substrate via, a second substrate, and a bonding structure. The first substrate includes a first dielectric material, and the first dielectric material includes a first conductive pad embedded therein. The through substrate via is formed in the first substrate. The second substrate includes a second dielectric material, and the second dielectric material includes a second conductive pad embedded therein, wherein the first dielectric material is different from the second dielectric material, the second conductive pad has a first height, the second dielectric material has a second height, and the first height is less than the second height. The bonding structure is formed between the first substrate and the second substrate, and the bonding structure includes the first conductive pad bonded to the second conductive pad, and the first dielectric material bonded to the second dielectric material.

According to some embodiments of the disclosure, one of the first dielectric material and the second dielectric material is made of a material which expands during a bonding process, and the other one of the first dielectric material and the second dielectric material is made of a material that contracts during the bonding process.

According to some embodiments of the disclosure, the semiconductor device further includes a contact structure formed over the first substrate, wherein the contact structure is between the through substrate via and the first dielectric material.

According to some embodiments of the disclosure, the semiconductor device further includes a transistor and a contact plug. The transistor is formed over the first substrate. The contact plug is formed over the transistor, and the contact structure is coupled to the through substrate via and the contact plug.

According to some embodiments of the disclosure, the semiconductor device further includes a diffusion barrier layer and a contact structure. The diffusion barrier layer is formed in the first dielectric material. The contact structure is formed over the first substrate, and the contact structure is formed between the through substrate via and the diffusion barrier layer.

Another aspect of the present disclosure provides a semiconductor device, including a first substrate, a through substrate via, a second substrate, and a bonding structure. The first substrate includes a first dielectric material, the first dielectric material includes a first recess pattern disposed therein, and the first dielectric material includes a first conductive pad. The through substrate via is formed in the first substrate. The second substrate includes a second dielectric material, and the second dielectric material includes a second conductive pad. The bonding structure is formed between the first substrate and the second substrate, wherein the bonding structure includes the first conductive pad bonded to the second conductive pad and the first dielectric material bonded to the second dielectric material.

According to some embodiments of the disclosure, the second dielectric material includes a second recess pattern disposed therein.

According to some embodiments of the disclosure, the first recess pattern includes a plurality of first recess features that are electrically isolated from each other and from the first conductive pad. The second recess pattern includes a plurality of second recess features that are electrically isolated from each other and from the second conductive pad.

According to some embodiments of the disclosure, at least one of the first recess features or at least one of the second recess features includes a cross-sectional shape corresponding to a circle or a polygon having at least three sides.

According to some embodiments of the disclosure, a percentage of a metal surface area of the first recess pattern relative to a total surface area of the first recess pattern is greater than 50%, and a percentage of a metal surface area of the second recess pattern relative to a total surface area of the second recess pattern is greater than 50%.

According to some embodiments of the disclosure, the semiconductor device further includes a contact structure formed over the first substrate, wherein the contact structure is between the through substrate via and the first dielectric material.

According to some embodiments of the disclosure, the semiconductor device further includes a transistor and a contact plug. The transistor is formed over the first substrate. The contact plug is formed over the first transistor, and the contact structure is coupled to the through substrate via and the first contact plug.

According to some embodiments of the disclosure, the first dielectric material and the second dielectric material are made of polyimide, polybenzoxazole, or benzocyclobutene polymer.

According to some embodiments of the disclosure, the semiconductor device further includes a diffusion barrier layer and a contact structure. The diffusion barrier layer is formed in the first dielectric material. The contact structure is formed between the through substrate via and the diffusion barrier layer.

Another aspect of the present disclosure provides a method of manufacturing a semiconductor device, including providing a first wafer and a second wafer, wherein a through substrate via is formed in the first wafer. A first dielectric material is formed in the first wafer. A first conductive pad is formed in the first dielectric material. A second dielectric material is formed in the second wafer. A second conductive pad is formed in the second dielectric material. The first wafer and the second wafer are bonded.

According to some embodiments of the disclosure, bonding the first wafer and the second wafer further includes bonding the first dielectric material of the first wafer to the second dielectric material of the second wafer, and bonding the first conductive pad disposed in the first dielectric material to the second conductive pad disposed in the second dielectric material.

According to some embodiments of the disclosure, the second conductive pad in the second dielectric material has a first height, the second dielectric material has a second height, and the first height is less than the second height.

According to some embodiments of the disclosure, the method further includes forming a first recess pattern in the first dielectric material, and forming a second recess pattern in the second dielectric material.

According to some embodiments of the disclosure, a percentage of a metal surface area of the first recess pattern relative to a total surface area of the first recess pattern is greater than 50%, and a percentage of a metal surface area of the second recess pattern relative to a total surface area of the second recess pattern is greater than 50%.

According to some embodiments of the disclosure, the method further includes forming a transistor in the first wafer, wherein the transistor is electrically coupled to a contact structure in the first wafer.

Due to the design of the bonding structures and the dielectric materials, the semiconductor devices and manufacturing methods disclosed by embodiments of the disclosure enhance adhesion and bonding strength, while also reducing stress induced during the manufacturing process.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor device and method for manufacturing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Figure 1A:
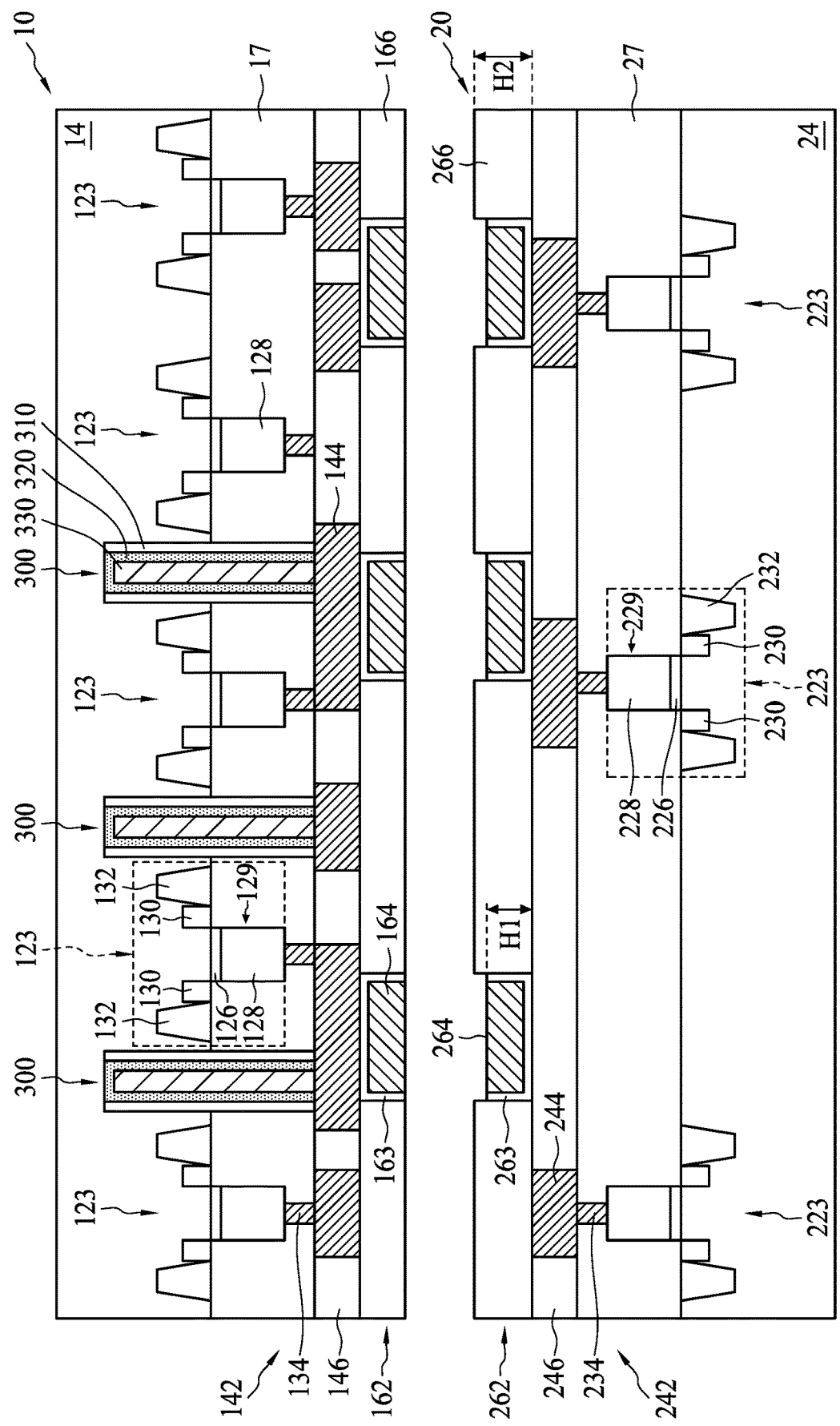
FIG. 1A to FIG. 1C depict cross-sectional representations of a semiconductor device during formation, in accordance with some embodiments of the present disclosure.
Figure 1B:
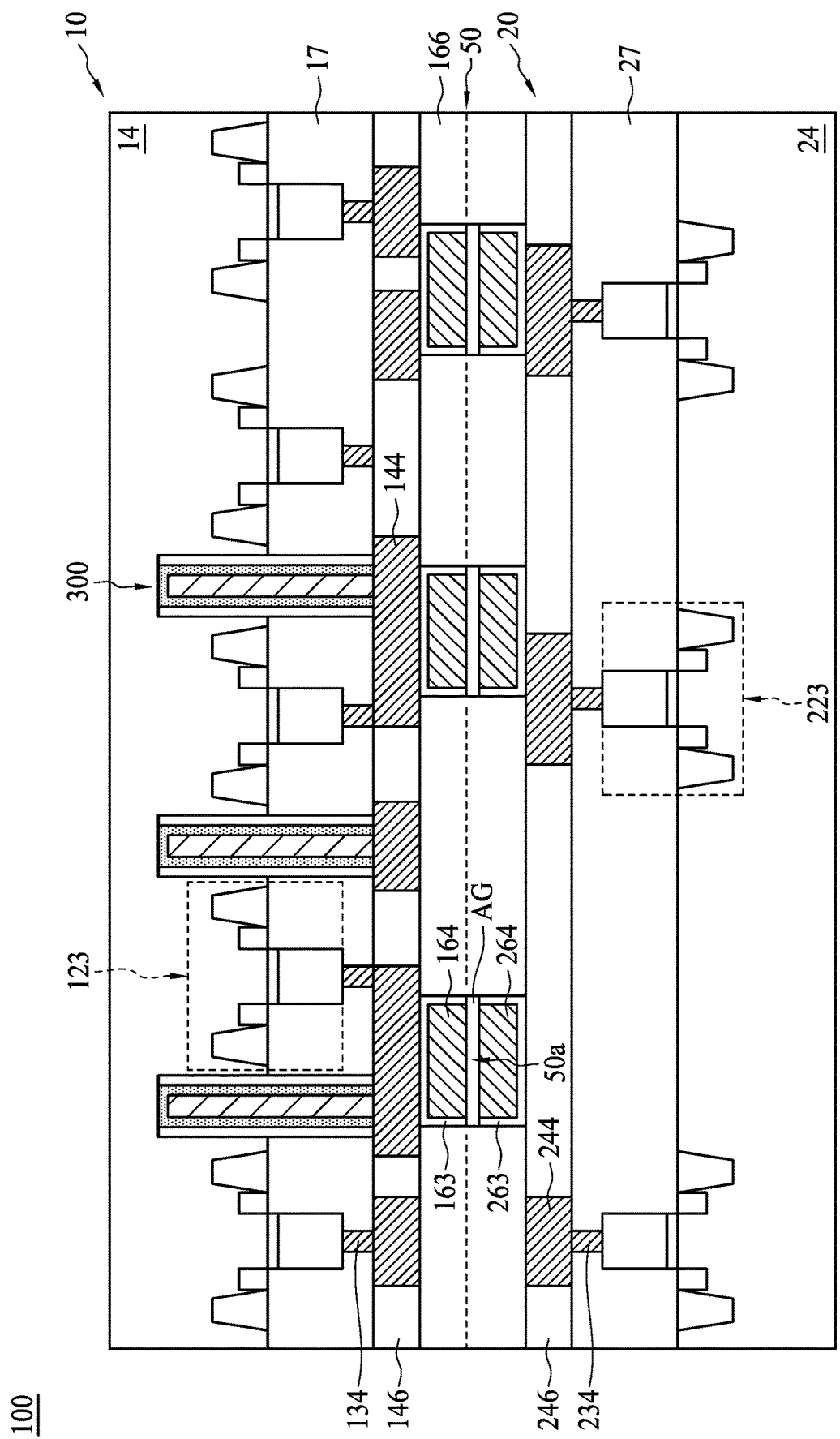
Figure 1C:
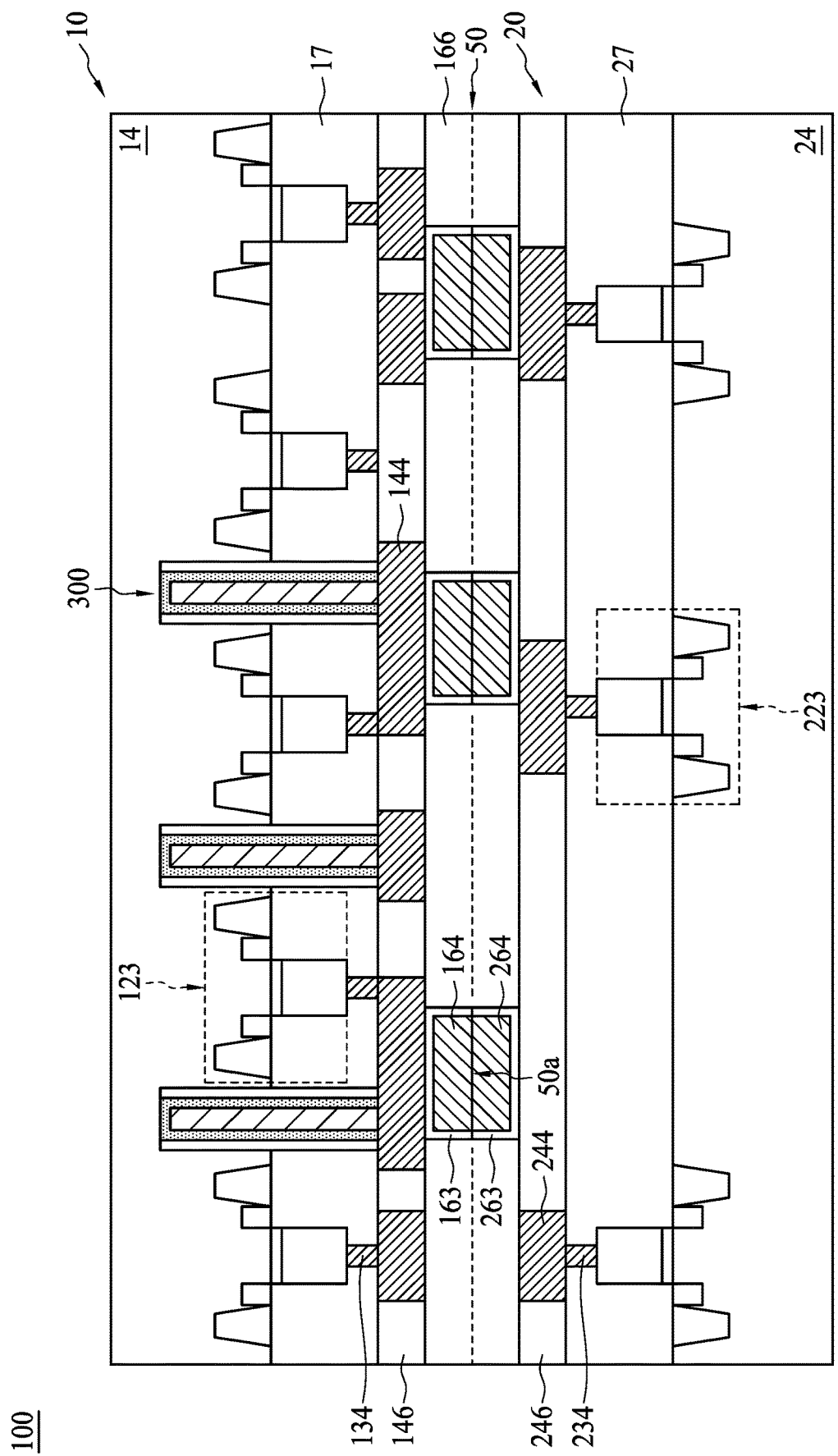

In accordance with some embodiments of the disclosure, FIGS. 1A to 1C depict cross-sectional representations of a semiconductor device during formation. FIG. 1A depicts a cross-sectional view of a portion of a first wafer 10 and a portion of a second wafer 20. The first wafer 10 includes a first substrate 14, which may be made of silicon or other semiconductor materials. In addition, or alternatively, the first substrate 14 may include other semiconductor materials, such as germanium. In some embodiments of the disclosure, the first substrate 14 may be made of an alloy semiconductor such as silicon germanium, silicon germanium carbide, gallium arsenic phosphide, or gallium indium phosphide. In some embodiments, the semiconductor substrate 14 may be made of a compound semiconductor such as silicon carbide, gallium arsenic, indium arsenide, or indium phosphide. In some embodiments, the first substrate 14 may include an epitaxial layer, such as an epitaxial layer overlying a bulk semiconductor, for example.

With reference to FIG. 1A, according to some embodiments, device regions 123 are formed in the first substrate 14 in a front-end of line (FEOL) process. Each of the device regions 123 includes a gate structure 129 disposed in a dielectric layer 17, source/drain regions 130, and isolation structures 132, such as shallow trench isolation structures. The gate structure 129 includes a gate dielectric layer 126 and a gate electrode 128, and may also include spacers (not shown). The device regions 123 may form various P-type metal-oxide semiconductor (PMOS) and/or N-type metal-oxide semiconductor (NMOS) devices, such as transistors, which may be interconnected to perform various functions. However, the device regions 123 depicted in FIG. 1A are merely illustrative, and the disclosure is not limited thereto. Other structures and devices may be formed on the substrate 14, such as diodes, photodiodes, resistors, capacitors, memories, and fuses.

Referring to FIG. 1A, a through substrate via 300 is formed between two adjacent device regions 123, and the through substrate via 300 extends into the substrate 14. The through substrate via 300 may be used to provide electrical connections and heat dissipation in semiconductor devices such as 3DICs, for example. Although three through substrate vias 300 are depicted in FIG. 1A, the number may be adjusted in accordance to actual applications. According to some embodiments, each through substrate via 300 includes a liner 310, a diffusion barrier layer 320, and a conductive material 330. The liner 310 may made of an insulating material, such as an oxide or a nitride. The liner 310 may be formed using a plasma enhanced chemical vapor deposition (PECVD) process or other applicable processes. The liner 310 may be a single layer or multiple layers. In some embodiments, the liner 310 has a thickness in a range from about 100 Å to about 5000 Å.

In some embodiments, the diffusion barrier layer 320 is made of Ta, TaN, Ti, TiN, or CoW. The diffusion barrier layer 320 may be formed by a physical vapor deposition (PVD) process. The conductive material 330 is made of copper (Cu), copper alloy, aluminum (Al), aluminum alloys, or combinations thereof. However, other applicable materials may be used. In some embodiments, the conductive material 330 is formed by plating. The stress induced by the through substrate via 300 may be reduced by minimizing the dimensions of the through substrate via 300 comparedto the dimensions of the first wafer 10.

With reference to FIG. 1A, a contact structure 142 is formed over the through substrate via 300 and device region 123 to individually connect to the through substrate via 300 and device region 123. In some embodiments, the contact structure 142 includes a contact plug 134 and conductive features 144. The contact plug 134 is embedded in the dielectric layer 17, and the conductive features 144 are embedded in an insulating material 146. In some embodiments, the insulating material 146 is made of silicon oxide. In some embodiments, the insulating material 146 includes multiple dielectric layers of dielectric materials. The contact structure 142 shown is merely an illustrative example. In other embodiments, the contact structure 142 may include other configurations and may include one or more conductive lines and via layers.

As shown in FIG. 1A, the first substrate 14 includes a first dielectric material 166, and the first dielectric material 166 includes a first conductive pad 164 embedded therein. A bonding structure 162 is formed over the contact structure 142, wherein the bonding structure 162 includes the first dielectric material 166 and the first conductive pad 164. The first conductive pad 164 may be a bond pad (or contact pad) formed on a top surface of the first wafer 10. The conductive features 144 are connected to the first conductive pad 164. The first conductive pad 164 may be made of conductive materials, such as copper (Cu), copper alloy, aluminum (Al), aluminum alloy, or combinations thereof. Other applicable materials may also be used for the first conductive pad 164.

In some embodiments, if the first conductive pad 164 is made of a metal, such as copper, a diffusion barrier layer 163 is added in the first dielectric material 166, as shown in FIG. 1A. The diffusion barrier layer 163 may be made of silicon nitride (SiN), silicon oxynitride (SiON), aluminum nitride (AlN), titanium nitride (TiN), or tantalum nitride (TaN). In some embodiments, the first conductive pad 164 is made of copper, and the diffusion barrier layer 163 is made of Ti, TiN, Ta, TaN, Ta/TaN, CoP or CoW. In some embodiments, the diffusion barrier layer 163 has a thickness in a range from about 5 Å to about 1000 Å.

With reference to FIG. 1A, the second wafer 20 includes a second substrate 24 and device regions 223. The device regions 223 are similar to the device regions 123 and include a gate structure 229, source/drain regions 230, and isolation structures 232. The gate structure 229 is similar to the gate structure 129 and includes a gate dielectric layer 226, a gate electrode 228, and possibly spacers (not shown). The gate dielectric layer 226 is similar to the gate dielectric layer 126, and the gate electrode 228 is similar to the gate electrode 128. In addition, the source/drain regions 230 in the device regions 223 are similar to the source/drain regions 130, and the isolation structures 232 in the device regions 223 are similar to the isolation structures 132.

As shown in FIG. 1A, the second wafer 24 includes a second dielectric material 266, and the second dielectric material 266 includes a second conductive pad 264 embedded therein. The second wafer 24 further includes a contact structure 242 and a bonding structure 262. The bonding structure 262 is formed over the contact structure 242, and the bonding structure 262 includes the second dielectric material 266 and the second conductive pad 264. The second conductive pad 264 may be a bond pad (or contact pad) formed on a top surface of the second wafer 20. Conductive features 244 are connected to the second conductive pad 264. The contact structure 242 is similar to the contact structure 142 and includes a contact plug 234 embedded in a dielectric layer 27 and the conductive features 244 embedded in an insulating material 246. The contact plug 234 is similar to similar to the contact plug 134, and the dielectric layer 27 is similar to the dielectric layer 17. The conductive features 244 are similar to the conductive features 144, and the insulating material 246 is similar to the insulating material 146. A diffusion barrier layer 263 may also be added if the second conductive pad 264 is made of a metal.

In some embodiments, the first dielectric material 166 is different from the second dielectric material 266. One of the first dielectric material 166 and the second dielectric material 266 is made of a material which expands during a bonding process, and the other one of the first dielectric material 166 and the second dielectric material 266 is made of a material that contracts during the bonding process. Such materials may be benzocyclobutene (BCB) polymer, polyimide (PI), polybenzoxazole (PBO), combinations thereof, or other suitable materials, which may be chosen to reduce stress induced by the through substrate via 300. In some embodiments, the second conductive pad 264 has a first height $H_1$, and the second dielectric material 266 has a second height $H_2$, as shown in FIG. 1A. In some embodiments, the first dielectric material 166 and the second dielectric material 266 are formed and applied to the contact structures 142 and 242 by spin coating. For example, the second dielectric material 266 may be spin coated to have the second height $H_2$, wherein the first height $H_1$ of the second conductive pad 264 is less than the second height $H_2$ of the second dielectric material 266.

Before the first wafer 10 is bonded to the second wafer 20, the wafers 10 and 20 are aligned, such that the first conductive pad 164 on the first wafer 10 can be bonded to the second conductive pad 264 on the second wafer 20, and the first dielectric material 166 on the first wafer 10 can be bonded to the second dielectric material 266 on the second wafer 20. In some embodiments, the alignment of the wafers 10 and 20 may be achieved by using an optical sensing method, although other applicable alignment methods may also be used.

With reference to FIG. 1B, according to some embodiments, after alignment, the wafers 10 and 20 are bonded together by hybrid bonding to form a stacking structure 100, which may be a 3DIC die stack, for example. The wafers 10 and 20 are hybrid bonded together by application of pressure and heat. During hybrid bonding, the stacking structure 100 may be heated to a temperature in a range from about 100° C. to about 200° C., such that the dielectric materials 166 and 266 become a non-confined viscous liquid and are reflowed. Accordingly, since one of the dielectric materials 166 and 266 expands and the other contracts during the bonding process, and the dielectric materials 166 and 266 are reflowed, voids AG in FIG. 1B can be eliminated to form the stacking structure 100 of FIG. 1C.

Next, the stacking structure 100 may be further heated to a higher temperature in a range from about 220° C. to about 380° C., such that the conductive pads 164 and 264 are interconnected by thermocompression bonding and the dielectric materials 166 and 266 are fully cured. In some embodiments, the pressure used in hybrid bonding is in a range from about 0.7 bar to about 10 bar. The hybrid bonding process may be performed in an inert environment, such as an environment filled with inert gas including $N_2$, Ar, He, or combinations thereof.

As shown in FIGS. 1B and 1C, hybrid bonding involves at least two types of bonding, including metal-to-metal bonding and non-metal-to-non-metal bonding. Referring to FIG. 1C, after the hybrid bonding process, a bonding structure 50 is formed between the wafers 10 and 20. The hybrid bonding structure 50 includes the conductive pads 164 and 264 bonded by metal-to-metal bonding and the dielectric materials 166 and 266 bonded by non-metal-to-non-metal bonding. As shown in FIG. 1C, the bonding structure 50 has a metallic bonding interface 50a between the conductive pads 164 and 264 but may not have a clear non-metallic interface between dielectric materials 166 and 266 due to the reflowing process.

Accordingly, the wafers 10 and 20 are bonded through the dielectric materials 166 and 266, rather than involving other dielectric layers. Since the bonding of the dielectric materials 166 and 266 involves selection of materials wherein one expands and the other contracts in the heating process, and the dielectric materials 166 and 266 are reflowed, voids AG in the dielectric materials 166 and 266 are eliminated and the bonding strength of the wafers 10 and 20 is enhanced.

Figure 2:
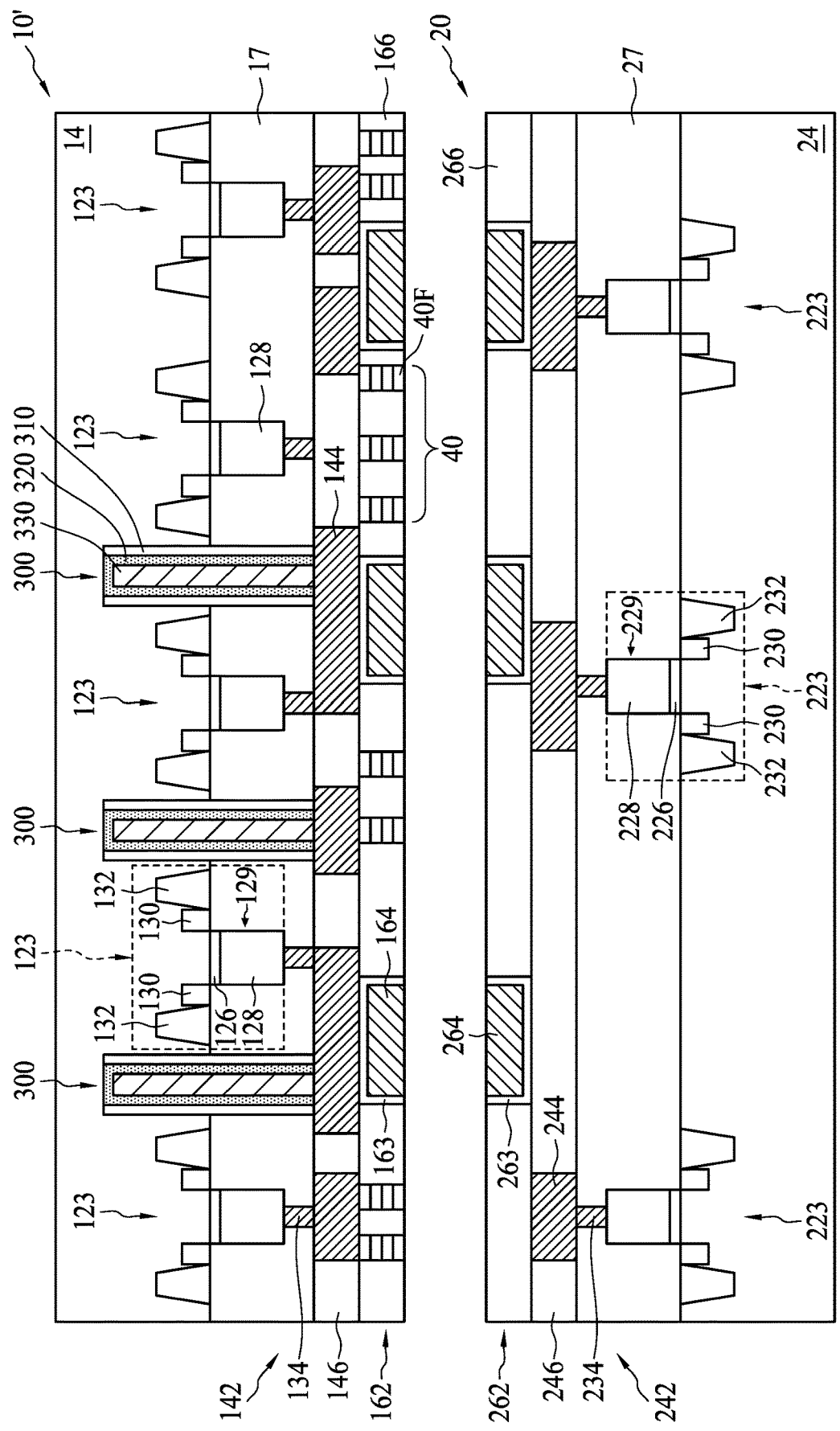
FIG. 2 and FIG. 3 depict cross-sectional representations of a semiconductor device during formation, in accordance with some embodiments of the present disclosure.
Figure 3:
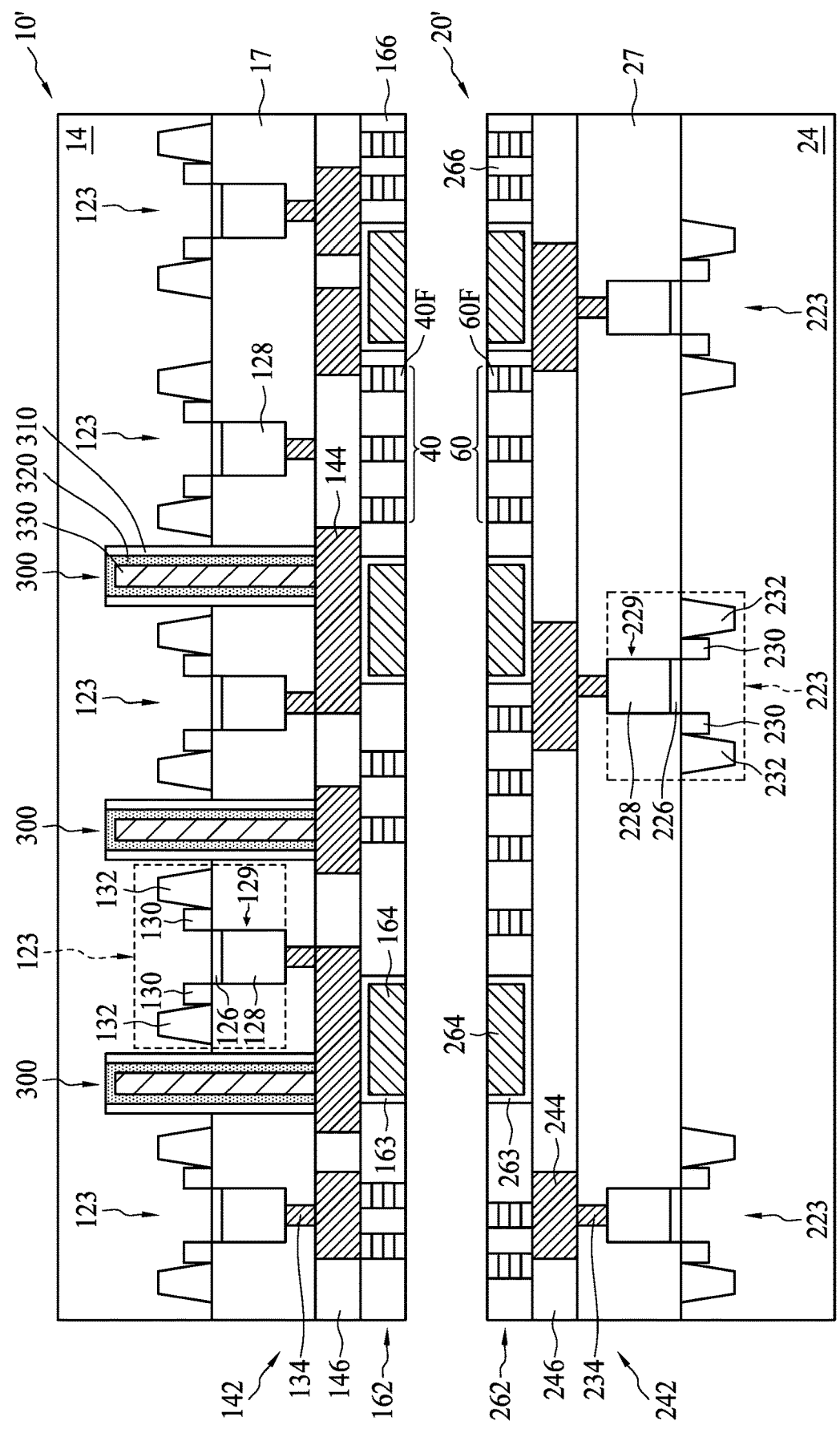

In some embodiments, as shown in the cross-sectional representations of FIG. 2 and FIG. 3, one or both of the dielectric materials 166 and 266 may include recess patterns to promote adhesion and planarity, and to reduce stress during the bonding process. With reference to FIG. 2, in a first wafer 10', the first dielectric material 166 includes a first recess pattern 40 disposed therein. The first recess pattern 40 includes a plurality of first recess features 40F that are electrically isolated from each other and from the first conductive pad 164. In some embodiments, the second dielectric material 266 may be coplanar with the second conductive pad 264. According to other embodiments, as shown in FIG. 3, a second recess pattern 60 may be included in the second dielectric material 266 of the wafer 20'. The second recess pattern 60 includes a plurality of second recess features 60F that are electrically isolated from each other and from the second conductive pad 264.

In some embodiments, at least one of the first recess features 40F or at least one of the second recess features 60F includes a cross-sectional shape corresponding to a circle or a polygon having at least three sides. A percentage of a metal surface area of the first recess pattern 40 relative to a total surface area of the first recess pattern 40 is greater than 50%, and a percentage of a metal surface area of the second recess pattern 60 relative to a total surface area of the second recess pattern 60 is greater than 50%. Accordingly, the formation of recess patterns in the dielectric materials may reduce stress during the bonding process by redistributing local stresses to larger portions of the wafers.

In some embodiments, the dielectric materials 166 and 266 may be made of benzocyclobutene (BCB) polymer, polyimide (PI), polybenzoxazole (PBO), combinations thereof, or other suitable materials. The recess features 40F and 60F may be made of a same material as the first and second conductive pads 164 and 264, respectively, or of other suitable materials. Moreover, the recess patterns 40 and 60 may not have electrical functions and may not be electrically connected to overlying active circuits. The recess patterns 40 and 60 and the recess features 40F and 60F may be formed during a back-end of line (BEOL) process, such as by blanket depositing a metal layer, and then performing an etch using $Cl_2$ and $BCl_3$ (e.g., chloride) as etchants, for example. In some embodiments, the recess patterns 40 and 60 may not be arranged in a linear array, but may be arranged in a non-linear, curvilinear, Fibonacci, geometric sequence, or other uniform distribution of recess feature elements. In other embodiments, the recess patterns 40 and 60 need not be arranged in a uniform distribution, but may include a random or otherwise irregular distribution of recess feature elements.

Figure 4:
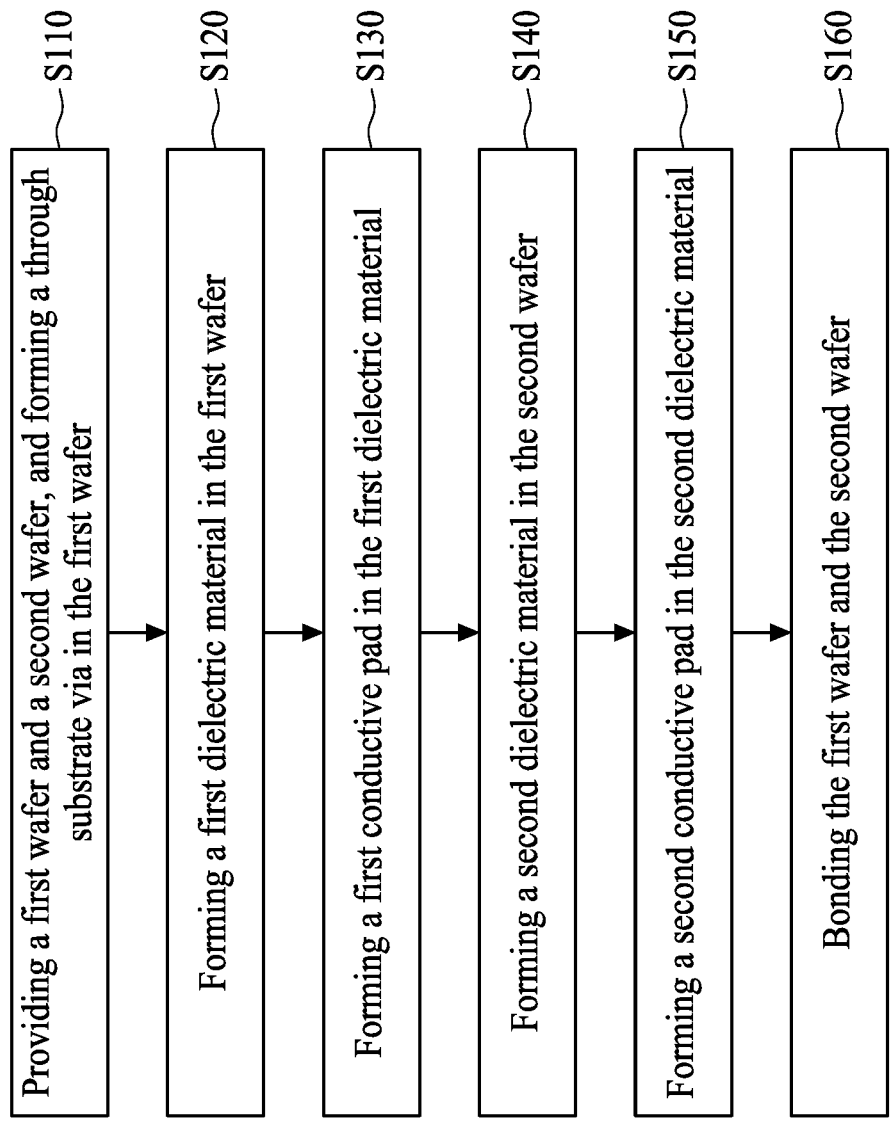
FIG. 4 illustrates a method for manufacturing a semiconductor device, in accordance with some embodiments of the present disclosure.

According to some embodiments of the disclosure, a method of manufacturing a semiconductor device is shown in FIG. 4. With reference to FIG. 4, the manufacturing method includes providing a first wafer and a second wafer, wherein a through substrate via is formed in the first wafer (Step S110). A first dielectric material is formed in the first wafer (Step S120). A first conductive pad is formed in the first dielectric material (Step S130). A second dielectric material is formed in the second wafer (Step S140). A second conductive pad is formed in the second dielectric material (Step S150). The first wafer and the second wafer are bonded (Step S160).

In some embodiments, bonding the first wafer and the second wafer further includes bonding the first dielectric material of the first wafer to the second dielectric material of the second wafer, and bonding the first conductive pad disposed in the first dielectric material to the second conductive pad disposed in the second dielectric material. In some embodiments, the second conductive pad in the second dielectric material has a first height, the second dielectric material has a second height, and the first height is less than the second height. In some embodiments, the method further includes forming a first recess pattern in the first dielectric material, and forming a second recess pattern in the second dielectric material. In some embodiments, a percentage of a metal surface area of the first recess pattern relative to a total surface area of the first recess pattern is greater than 50%, and a percentage of a metal surface area of the second recess pattern relative to a total surface area of the second recess pattern is greater than 50%. In some embodiments, the method further includes forming a transistor in the first wafer, wherein the transistor is electrically coupled to a contact structure in the first wafer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a first substrate comprising a first dielectric material, the first dielectric material comprising a first conductive pad embedded therein;
   a through substrate via formed in the first substrate;
   a second substrate comprising a second dielectric material, the second dielectric material comprising a second conductive pad embedded therein, wherein the first dielectric material is different from the second dielectric material, the second conductive pad has a first height, the second dielectric material has a second height, and the first height is less than the second height; and
   a bonding structure formed between the first substrate and the second substrate, wherein the bonding structure comprises the first conductive pad bonded to the second conductive pad and the first dielectric material bonded to the second dielectric material.

2. The semiconductor device of claim 1, wherein one of first dielectric material and the second dielectric material is made of a material which expands during a bonding process, and the other one of the first dielectric material and the second dielectric material is made of a material that contracts during the bonding process.

3. The semiconductor device of claim 1, further comprising:
   a contact structure formed over the first substrate, wherein the contact structure is formed between the through substrate via and the first dielectric material.

4. The semiconductor device of claim 3, further comprising:
   a transistor formed over the first substrate; and
   a contact plug formed over the transistor, wherein the contact structure is coupled to the through substrate via and the contact plug.

5. The semiconductor device of claim 1, further comprising:
   a diffusion barrier layer formed in the first dielectric material; and
   a contact structure formed over the first substrate, wherein the contact structure is formed between the through substrate via and the diffusion barrier layer.

6. A semiconductor device, comprising:
   a first substrate comprising a first dielectric material, the first dielectric material comprising a first recess pattern disposed therein, and the first dielectric material comprising a first conductive pad, wherein the first recess pattern comprises a plurality of first recess features that are electrically and mechanically isolated from each other and from the first conductive pad;
   a through substrate via formed in the first substrate;
   a second substrate comprising a second dielectric material, the second dielectric material comprising a second conductive pad; and
   a bonding structure formed between the first substrate and the second substrate, wherein the bonding structure comprises the first conductive pad bonded to the second conductive pad and the first dielectric material bonded to the second dielectric material.

7. The semiconductor device of claim 6, wherein the second dielectric material comprises a second recess pattern disposed therein.

8. The semiconductor device of claim 7, wherein:
   the second recess pattern comprises a plurality of second recess features that are electrically and mechanically isolated from each other and from the second conductive pad.

9. The semiconductor device of claim 8, wherein at least one of the first recess features or at least one of the second recess features comprises a cross-sectional shape corresponding to a circle or a polygon having at least three sides.

10. The semiconductor device of claim 7, wherein a percentage of a metal surface area of the first recess pattern relative to a total surface area of the first recess pattern is greater than 50%, and a percentage of a metal surface area of the second recess pattern relative to a total surface area of the second recess pattern is greater than 50%.

11. The semiconductor device of claim 6, further comprising:
   a contact structure formed over the first substrate, wherein the contact structure is formed between the through substrate via and the first dielectric material.

12. The semiconductor device of claim 11, further comprising:
   a transistor formed over the first substrate; and
   a contact plug formed over the first transistor, wherein the contact structure is coupled to the through substrate via and the first contact plug.

13. The semiconductor device of claim 6, wherein the first dielectric material and the second dielectric material are made of polyimide, polybenzoxazole, or benzocyclobutene polymer.

14. The semiconductor device of claim 6, further comprising:
   a diffusion barrier layer formed in the first dielectric material; and a contact structure formed over the first substrate, wherein the first contact structure is formed between the through substrate via and the diffusion barrier layer.

15. A method of manufacturing a semiconductor device, the method comprising:
   providing a first wafer and a second wafer, wherein a through substrate via is formed in the first wafer;
   forming a first dielectric material in the first wafer;
   forming a first conductive pad in the first dielectric material;
   forming a first recess pattern in the first dielectric material, wherein the first recess pattern comprises a plurality of first recess features that are electrically and mechanically isolated from each other and from the first conductive pad;
   forming a second dielectric material in the second wafer;
   forming a second conductive pad in the second dielectric material; and
   bonding the first wafer and the second wafer.

16. The method of claim 15, wherein bonding the first wafer and the second wafer further comprises:
   bonding the first dielectric material of the first wafer to the second dielectric material of the second wafer, and
   bonding the first conductive pad disposed in the first dielectric material to the second conductive pad disposed in the second dielectric material.

17. The method of claim 16, wherein the second conductive pad in the second dielectric material has a first height, the second dielectric material has a second height, and the first height is less than the second height.

18. The method of claim 15, further comprising:
   forming a second recess pattern in the second dielectric material.

19. The method of claim 18, wherein a percentage of a metal surface area of the first recess pattern relative to a total surface area of the first recess pattern is greater than 50%, and a percentage of a metal surface area of the second recess pattern relative to a total surface area of the second recess pattern is greater than 50%.

20. The method of claim 15, further comprising:
   forming a transistor in the first wafer, wherein the transistor is electrically coupled to a contact structure in the first wafer.

* * * * *